United States Patent
Chang et al.

(10) Patent No.: US 10,124,789 B2
(45) Date of Patent: Nov. 13, 2018

(54) IN-RANGE CURRENT SENSOR FAULT DETECTION

(71) Applicant: FORD GLOBAL TECHNOLOGIES, LLC, Dearborn, MI (US)

(72) Inventors: Xiaoguang Chang, Northville, MI (US); Xu Wang, Dearborn, MI (US); Chuan He, Northville, MI (US); Josephine S. Lee, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 524 days.

(21) Appl. No.: 14/015,344

(22) Filed: Aug. 30, 2013

(65) Prior Publication Data

US 2015/0066262 A1   Mar. 5, 2015

(51) Int. Cl.
| | |
|---|---|
| *B60W 20/10* | (2016.01) |
| *B60W 20/00* | (2016.01) |
| *B60L 11/18* | (2006.01) |
| *B60W 10/26* | (2006.01) |
| *B60L 3/00* | (2006.01) |
| *B60W 20/50* | (2016.01) |
| *B60W 10/08* | (2006.01) |
| *G01R 35/00* | (2006.01) |

(52) U.S. Cl.
CPC ......... *B60W 20/106* (2013.01); *B60L 3/0038* (2013.01); *B60L 11/1861* (2013.01); *B60L 11/1864* (2013.01); *B60W 10/08* (2013.01); *B60W 10/26* (2013.01); *B60W 20/50* (2013.01); *B60L 2240/547* (2013.01); *B60L 2240/549* (2013.01); *B60L 2240/80* (2013.01); *B60L 2270/12* (2013.01); *B60W 2510/244* (2013.01); *B60W 2710/08* (2013.01); *G01R 35/00* (2013.01); *Y02T 10/7005* (2013.01); *Y02T 10/7044* (2013.01); *Y02T 10/7061* (2013.01)

(58) Field of Classification Search
CPC .. G01N 27/416; B60W 20/106; B60W 20/50; B60W 10/26; B60W 2510/244; B60L 11/1864; B60L 3/0038; B60L 11/1861; B60L 2240/80; B60L 2270/12; B60L 2240/547; B60L 2240/549; G01R 35/00
USPC .................................................. 324/426–429
See application file for complete search history.

(56) References Cited

U.S. PATENT DOCUMENTS

| | | |
|---|---|---|
| 7,116,239 B2 | 10/2006 | Muratov et al. |
| 7,994,798 B2 | 8/2011 | Williams et al. |
| 8,390,296 B2 | 3/2013 | Jung et al. |
| 2012/0139546 A1* | 6/2012 | Wortham ...................... 324/427 |

(Continued)

*Primary Examiner* — Mussa A Shaawat
*Assistant Examiner* — Michael V Kerrigan
(74) *Attorney, Agent, or Firm* — David B. Kelley; Brooks Kushman P.C.

(57) ABSTRACT

A current sensor fault detection system is disclosed which enables detection of a current sensor fault while the current sensor is operating and providing a current sensor output which is within a normal operating range. The current sensor is monitored by at least one controller which compares a change in battery state of charge error with a predetermined threshold. The change in battery state of charge error is a difference between a first change in battery state of charge calculated by integrating battery current with respect to a time and a second change in battery state of charge calculated based on the battery open circuit voltage during the time.

9 Claims, 6 Drawing Sheets

(56) References Cited

U.S. PATENT DOCUMENTS

2012/0235622 A1* 9/2012 Welchko ............... B60L 3/0038
                                                    318/722
2013/0077194 A1   3/2013 Hasan et al.

* cited by examiner

IN-RANGE CURRENT SENSOR FAULT DETECTION

TECHNICAL FIELD

This disclosure relates to detection of a current sensor fault while the sensor is operating within a valid operating range.

BACKGROUND

Current sensors are used in hybrid vehicles to measure the current flowing into and out of battery packs. The accuracy and operation of these sensors may be important in monitoring the overall hybrid system operation—allowing for the vehicles to meet the emission and safety requirements. Traditionally, a sensor fault is determined if the sensor provides an output which is outside of a tolerable range of operation. It is more difficult to detect a sensor fault when the sensor is providing output data which is within a specified and normal operating range.

Currently, vehicles equipped with current sensors detect a fault when the sensor stops outputting data or if the output exceeds a specified operating range.

SUMMARY

A current sensor fault detection strategy is disclosed which enables detection of a current sensor fault while the current sensor is operating and providing a current sensor output which is within a normal operating range. The current sensor is monitored by at least one controller which, in certain examples, compares a change in battery state of charge error with a predetermined threshold. The change in battery state of charge error may be derived from a difference between a first change in battery state of charge calculated by integrating battery current with respect to a time and a second change in battery state of charge calculated based on the battery open circuit voltage during the time. If the error is greater than the threshold, the controller may adjust the operation of the electric machine. The operation changes may include limiting the current from the battery or generating a signal.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
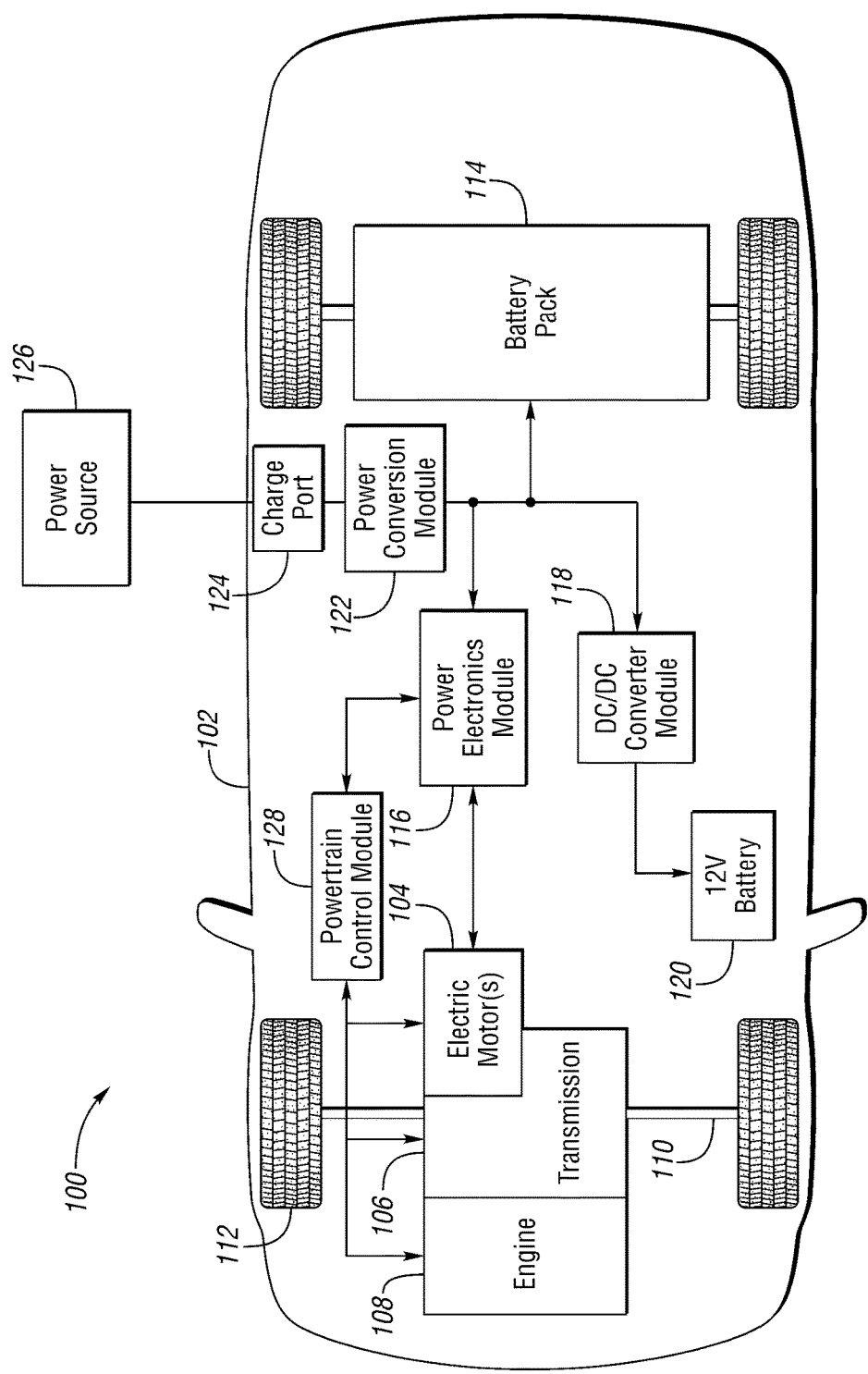
FIG. 1 illustrates an example hybrid-electric vehicle with a battery pack.

FIG. 1 depicts an example of a plug-in hybrid-electric vehicle. A plug-in hybrid-electric vehicle 102 may comprise one or more electric motors 104 mechanically connected to a hybrid transmission 106. In addition, the hybrid transmission 106 is mechanically connected to an engine 108. The hybrid transmission 106 may also be mechanically connected to a drive shaft 110 that is mechanically connected to the wheels 112. The electric motors 104 can provide propulsion when the engine 108 is turned on. The electric motors 104 can provide deceleration capability when the engine 108 is turned off. The electric motors 104 may be configured as generators and can provide fuel economy benefits by recovering energy that would normally be lost as heat in the friction braking system. The electric motors 104 may also reduce pollutant emissions since the hybrid electric vehicle 102 may be operated in electric mode under certain conditions.

The fraction battery or battery pack 114 stores energy that can be used by the electric motors 104. A vehicle battery pack 114 typically provides a high voltage DC output. The battery pack 114 is electrically connected to a power electronics module 116. The power electronics module 116 is also electrically connected to the electric motors 104 and provides the ability to bi-directionally transfer energy between the battery pack 114 and the electric motors 104. For example, a typical battery pack 14 may provide a DC voltage while the electric motors 104 may require a three-phase AC current to function. The power electronics module 116 may convert the DC voltage to a three-phase AC current as required by the electric motors 104. In a regenerative mode, the power electronics module 116 will convert the three-phase AC current from the electric motors 104 acting as generators to the DC voltage required by the battery pack 114. The methods described herein are equally applicable to a pure electric vehicle or any other device using a battery pack.

In addition to providing energy for propulsion, the battery pack 114 may provide energy for other vehicle electrical systems. A typical system may include a DC/DC converter module 118 that converts the high voltage DC output of the battery pack 114 to a low voltage DC supply that is compatible with other vehicle loads. Other high voltage loads, such as compressors and electric heaters, may be connected directly to the high-voltage bus from the battery pack 114. In a typical vehicle, the low voltage systems are electrically connected to a 12V battery 120. An all-electric vehicle may have a similar architecture but without the engine 108.

The battery pack 114 may be recharged by an external power source 126. The external power source 126 may provide AC or DC power to the vehicle 102 by electrically connecting through a charge port 124. The charge port 124 may be any type of port configured to transfer power from the external power source 126 to the vehicle 102. The charge port 124 may be electrically connected to a power conversion module 122. The power conversion module may condition the power from the external power source 126 to provide the proper voltage and current levels to the battery pack 114. In some applications, the external power source 126 may be configured to provide the proper voltage and current levels to the battery pack 114 and the power conversion module 122 may not be necessary. The functions of the power conversion module 122 may reside in the external power source 126 in some applications. The vehicle engine, transmission, electric motors and power electronics may be controlled by a powertrain control module (PCM) 128.

In addition to illustrating a plug-in hybrid vehicle, FIG. 1 can illustrate a battery electric vehicle (BEV) if component 108 is removed. Likewise, FIG. 1 can illustrate a traditional hybrid electric vehicle (HEV) or a power-split hybrid electric vehicle if components 122, 124, and 126 are removed.

Figure 2:
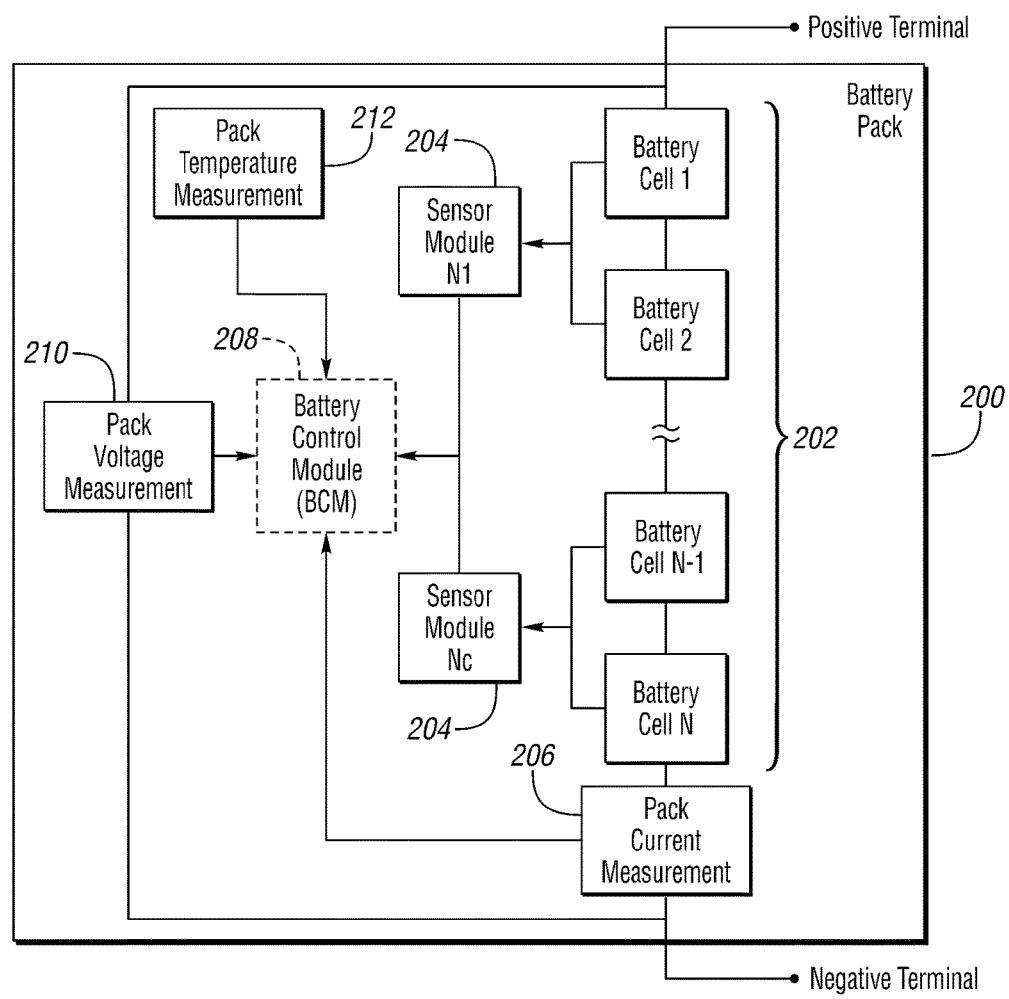
FIG. 2 illustrates a battery pack arrangement comprised of battery cells and battery cell monitoring and controlling systems.

The individual battery cells within a battery pack may be constructed from a variety of chemical formulations. Typical battery pack chemistries may include but are not limited to lead acid, nickel cadmium (NiCd), nickel-metal hydride (NIMH), Lithium-Ion or Lithium-Ion polymer. FIG. 2 shows a typical battery pack 200 in a simple series configuration of N battery cell modules 202. The battery cell modules 202 may contain a single battery cell or multiple battery cells electrically connected in parallel. The battery pack, however, may be composed of any number of individual battery cells and battery cell modules connected in series or parallel or some combination thereof. A typical system may have one or more controllers, such as a Battery Control Module (BCM) 208 that monitors and controls the performance of the battery pack 200. The BCM 208 may monitor several battery pack level characteristics such as pack current measured by a current sensor 206, pack voltage 210 and pack temperature 212. The performance of the current sensor 206 may be essential, in certain arrangements, to build a reliable battery monitoring system. The accuracy of the current sensor may be useful to estimate the battery state of charge and capacity. A current sensor may utilize a variety of methods based on physical principles to detect the current including a Hall effect IC sensor, a transformer or current clamp, a resistor where the voltage is directly proportional to the current through it, fiber optics using an interferometer to measure the phase change in the light produced by a magnetic field, or a Rogowski coil.

In addition to the pack level characteristics, there may be battery cell level characteristics that need to be measured and monitored. For example, the terminal voltage, current, and temperature of each cell may be measured. A system may use a sensor module 204 to measure the characteristics of one or more battery cell modules 202. The characteristics may include battery cell voltage, temperature, age, number of charge/discharge cycles, etc. Typically, a sensor module will measure battery cell voltage. Battery cell voltage may be voltage of a single battery or of a group of batteries electrically connected in parallel or in series. The battery pack 200 may utilize up to $N_c$ sensor modules 204 to measure the characteristics of all the battery cells 202. Each sensor module 204 may transfer the measurements to the BCM 208 for further processing and coordination. The sensor module 204 may transfer signals in analog or digital form to the BCM 208.

Figure 3:
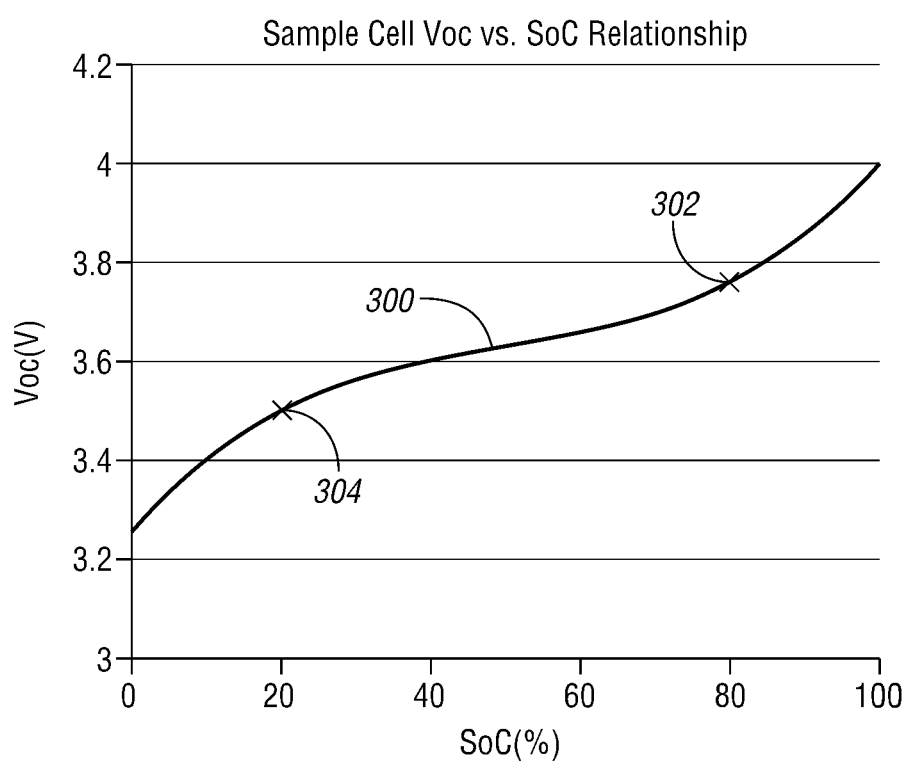
FIG. 3 is a graph that illustrates the open-circuit voltage (Voc) vs. battery state of charge (SoC) relationship for a typical Li-Ion battery cell.

For a typical Lithium-Ion battery cell, there is a relationship between SoC and the open-circuit voltage ($V_{oc}$) such that $V_{oc}=f(SoC)$. FIG. 3 is a typical curve 300 showing the open-circuit voltage, $V_{oc}$, as a function of SoC. The relationship between SoC and $V_{oc}$ may be determined from an analysis of battery properties or from testing the battery cells. The function may be such that SoC may be calculated as $f^{-1}(V_{oc})$. The function or the inverse function may be implemented as a table lookup or an equivalent equation. The exact shape of the curve 300 may vary based on the exact formulation of the Lithium-Ion battery. The voltage, $V_{oc}$, changes as a result of charging and discharging of the battery.

There are multiple ways to determine a battery SoC including measurement of open circuit voltage, accumulation of the amount of charge that enters or exits the battery, use of a hydrometer on the battery electrolyte, impedance spectroscopy and quantum magnetism. The measurement of open circuit voltage requires that the load is disconnected from the battery and that the battery terminals are "floating." Along with the terminals "floating," the battery must "rest" or settle before the measurement is taken. If the battery is under load where current is flowing into or out of the battery, when the battery terminals are disconnected, the open circuit voltage will not be an accurate representation of the battery SoC until the charge has settled. Due to this aspect, using the open circuit voltage is not an ideal way to determine the battery SoC while the battery is in operation. The use of Coulomb counting is a preferred method while the battery is in operation. This method measures the current traveling into or out of the battery during a given period of time. One problem with this method is that if there is a fault in the current sensor, the calculation of the battery SoC will not be accurate. During operation of a hybrid vehicle, it is critical to accurately determine the battery SoC so that the BCM 208 can utilize the full operational range of the battery SoC.

Figure 4:
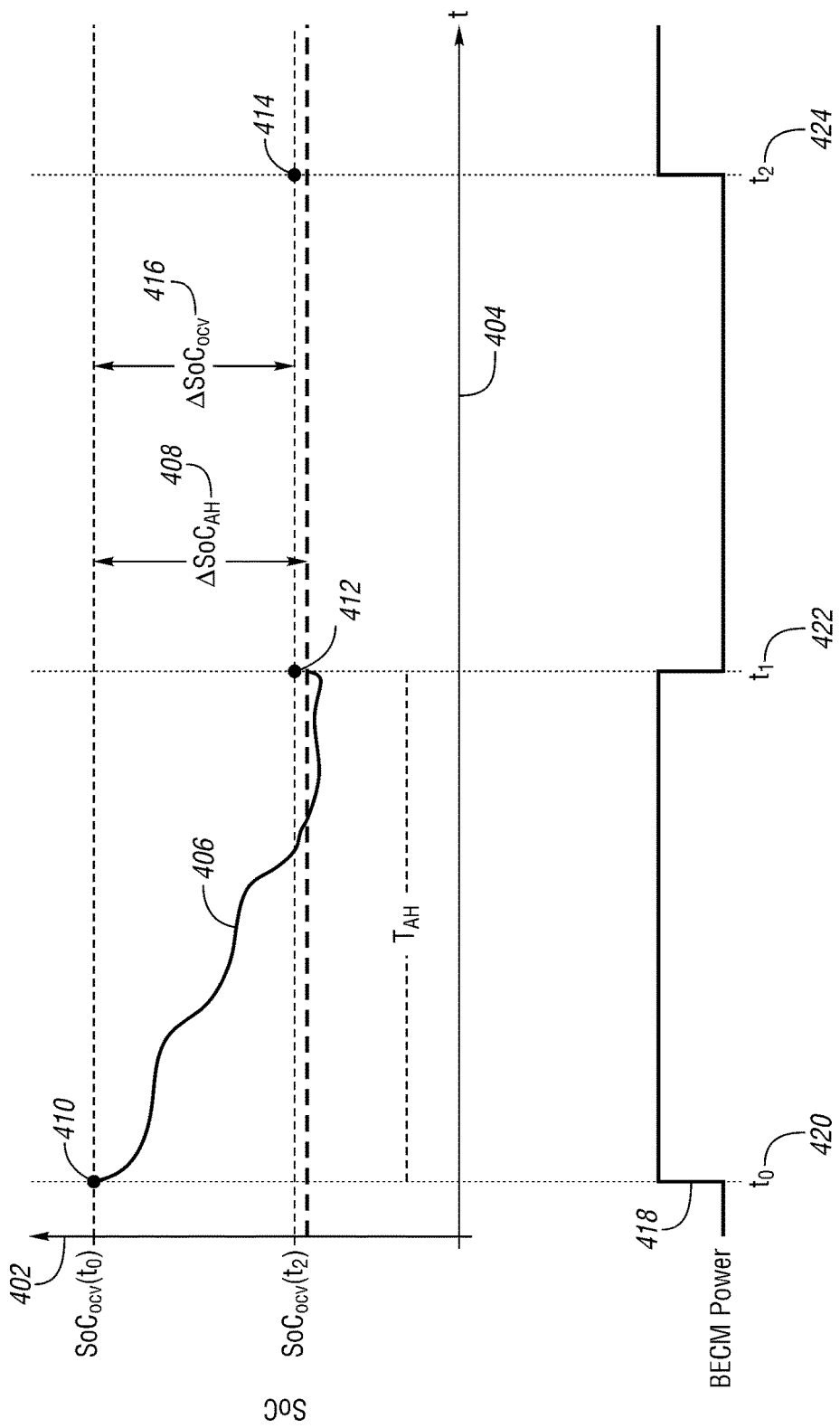
FIG. 4 illustrates different methods of calculating change in SoC using a graph of battery SoC vs. time.

FIG. 4 illustrates different methods of calculating change in SoC using a graph of battery SoC 402 vs. time 404. As a vehicle is operated, the battery SoC changes with respect to time. A battery SoC may increase during operation, as illustrated as BECM power 418 which is vehicle activation, for many reasons including the use of regenerative braking (a vehicle traveling down a hill or a vehicle deceleration request). Also, the battery SoC may decrease during operation such as utilizing the battery to power an electric machine or electric accessories. The instantaneous SoC 406 shown over a time period $T_{AH}$ has a change in SoC over the time period $T_{AH}$ ($\Delta SoC_{AH}$) 408. The change in SoC over a period can be obtained from the ampere hour integration which is based on a current sensor reading. The equation is $$\Delta Ah_1 = \int_{t_0}^{t_1} i(t)dt$$

In this equation $t_0$ 420 is the point in time at which the system is powered up, the time prior to this point is a pre-drive time. $t_1$ 422 is the point in time at which the system is powered down, where time after this point is a post-drive time and i is the battery pack current measured by the current sensor. $\Delta Ah_1$ can be converted to $\Delta SoC_{AH}$ 408 which is the change in SoC over the time period $T_{AH}$ by dividing $\Delta Ah_1$ by the battery Capacity C.

Ampere hour integration can also be estimated as $\Delta Ah_2$ by measuring the open circuit voltage (OCV) and utilizing the relationship of OCV vs. SoC 300. This equation is expressed as $$\Delta Ah_2 = \frac{C \times \sum_{n=1}^{N} [f(v_{n,0}^{oc}) - f(v_{n,1}^{oc}) - \Delta Ah_{cb}(n)]}{N}$$

In this equation, N is the number of battery cells in the battery pack, $v_{n,0}^{oc}$ is the open circuit voltage measured immediately prior to the last power up, $SoC_{OCV}(t_0)$ 410 is the SoC of the battery measured by using the SoC-OCV relationship 300 immediately prior to the last power up. $v_{n,1}^{oc}$ is the open circuit voltage measured after a settling time (after the system is powered down), $SoC_{OCV}(t_1)$ 412 is the SoC of the battery measured by using the SoC-OCV relationship 300 measured after a settling time after system powered down ($t_1$). The settling time is the time required for the charge in the battery to substantially reach equilibrium after the battery is powered down. The settling time depends upon many factors including the current flow prior to power down, the age of the battery, the SoC of the battery, the temperature of the battery, etc. In this equation, $T_1$ 422 is the time the system is powered down and the settling time. C is the capacity of the battery and f is the relationship between SoC and OCV $SoC=f(v^{oc})$. One method of determining the relationship, f, is by battery testing and characterization. For example, the relationship, f, for a lithium-ion battery may be represented as a monotone curve as shown in FIG. 3. $\Delta Ah_{cb}(n)$ is the ampere-hour integration introduced by both BCM on and off cell balancing for cell n. $\Delta Ah_{cb}(n)$ equals cell balancing discharge current multiplying the time when cell n's balancing circuit is closed.

$\Delta Ah_2$ can be converted to $\Delta SoC_{OCV}$ 416 which is the change in SoC over the time period $T_{AH}$ by dividing $\Delta Ah_2$ by the battery capacity C. Also when calculating $\Delta SoC_{OCV}$ 416, the point in time to measure the $v_{n,1}^{oc}$ or $SoC_{OCV}(t_1)$ 412 is shown at point $t_1$ 422. It, however, can be done at any point in between $t_1$ 422 and $t_2$ 424, which is the point immediately prior to the subsequent power up. The SoC value at point $t_2$ 424 is represented as $SoC_{OCV}(t_2)$ 414 which is illustrated as being equal to $SoC_{OCV}(t_1)$, however in practice, the SoC will decrease from $SoC_{OCV}(t_1)$ to $SoC_{OCV}(t_2)$ 414 as a function of battery age, state of charge, temperature, and other factors.

Using the $\Delta Ah_2$ is an accurate estimation of the delta ampere-hour change after a driving cycle for many reasons including (i) the battery capacity is substantially constant over a period of time, (ii) the cell voltage sensor is very accurate and (iii) the sensor accuracy remains high even during cell rebalance. An example of the accuracy is that a response of approximately 2 millivolts will result in at most a $$\left(\frac{0.5}{N}\right)\%$$

relative error in delta ampere-hour measurement.

One of the issues of the use of a current sensor is determining if the sensor is operating properly. One way of determining if the current sensor is operating properly is to read the sensor output. If the sensor output is outside of a valid operational range, the sensor is determined to be at fault. The output may be outside the valid operational range if the output is either 0 or at full-scale, which may indicate that the sensor is possibly shorted to either power or ground, this is called an out-of-range fault. It is difficult to determine if the sensor is at fault when the sensor output is within a valid operational range, referred to as an in-range fault. By evaluating the current sensor performance by using the difference $|\Delta SoC_{AH}-\Delta SoC_{OCV}|$ between two delta SoC estimates or the two delta ampere-hour estimates, a reliable and accurate sensor assessment may be determined. If the current sensor is good, the $|\Delta SoC_{AH}-\Delta SoC_{OCV}|$ value will be close to zero. If the current sensor performance is bad, the $|\Delta SoC_{AH}-\Delta SoC_{OCV}|$ value will be much greater than zero. If $|\Delta SoC_{AH}-\Delta SoC_{OCV}|$ is greater than a threshold value determined by calibration, engineering analysis or design, the sensor can be determined to be faulty and the battery system can adjust operation accordingly. If the sensor is at fault but not detected, as in an in-range fault not detected, the vehicle fuel economy and drivability will be reduced and the vehicle emission will increase.

When an in-range fault is detected, the vehicle operation may enter a specific mode of operation. This operation mode may encompass many different steps and limitation. First, the BECM may reduce the power limit to the electric machine and energy generated by the engine affecting the drivability, fuel economy and emission. This would be to manage possible SoC changes to reduce the possibility of the SoC decreasing or increasing outside a normal operation range. Second, the BECM may not update SoC because the current reading from the current sensor is not reliable. Then, the BECM may not update the battery model which is used to calculate the battery power capability online and the BECM may not accumulate ampere-hours, which can be used to estimate battery capacity. In a BEV and plug-in vehicle, battery capacity may be important, which determines the EV range. Also, if the current sensor accuracy is not reliable, the battery may not be charged to 100% SoC during a plug-in charge cycle for the PHEV and BEV because the BECM cannot conduct constant-voltage charge if current is not available.

Figure 5:
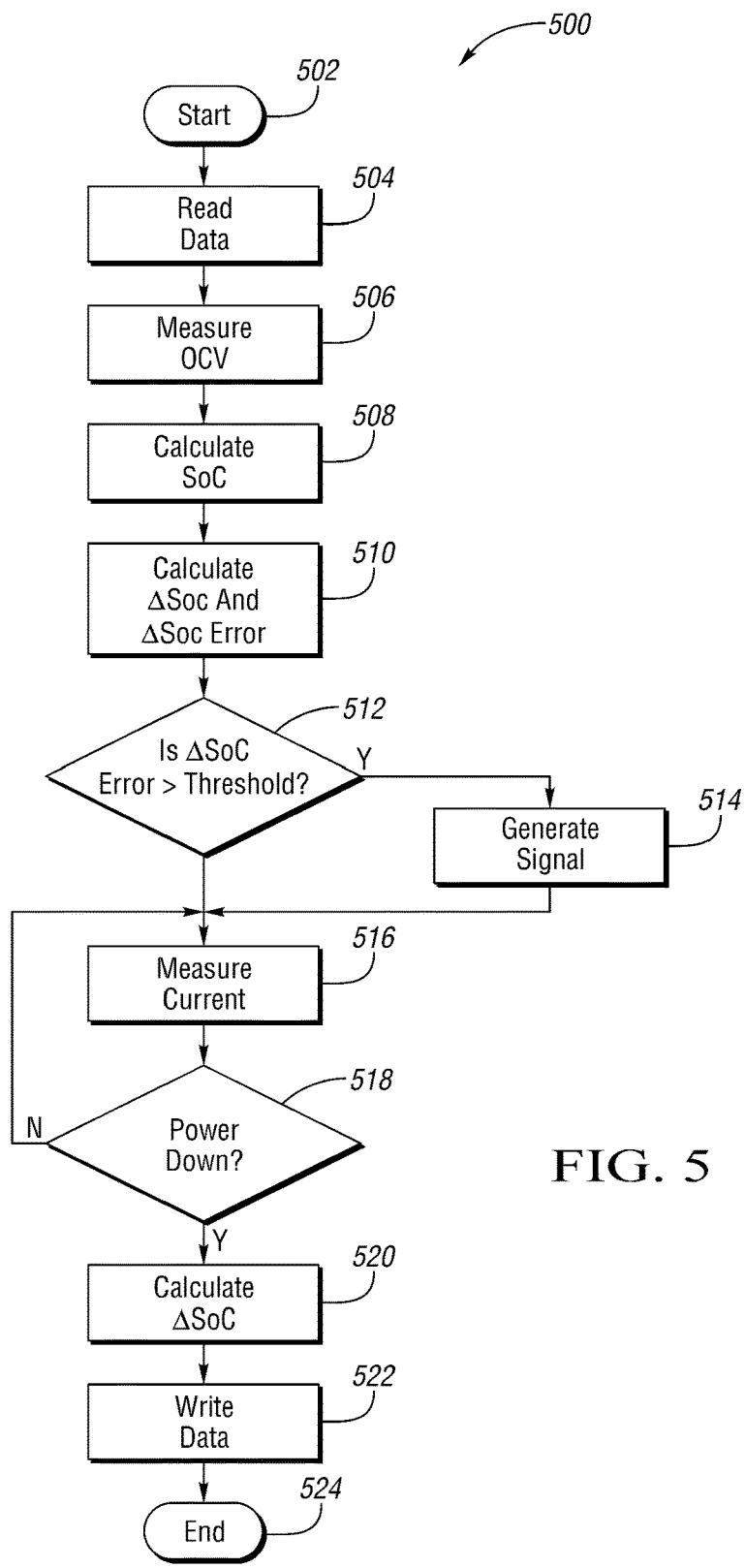
FIG. 5 illustrates a flow diagram of fault detection determined at system power up at a subsequent power cycle.

FIG. 5 illustrates a flow diagram of the fault detection determined at system power up at a subsequent power cycle 500. This may performed at time $T_2$ 424 where the start 502 is immediately prior to the system power up. Next, parameters from the last operation are read from RAM, battery back-up RAM, non-volatile memory, or other storage; those parameters may include $\Delta SoC_{AH}$ 408, $T_{AH}$, $SoC_{OCV}(t_0)$, etc. $\Delta SoC_{AH}$ is the change in SoC of the previous drive cycle, $T_{AH}$ is the time of the previous drive cycle, and $SoC_{OCV}(t_o)$ is the beginning SoC value from the previous drive cycle. The OCV is measured in block 506 prior to system power up or incident to system power up. The measurement from block 506 and other data is used to calculate $SoC_{OCV}$ at a point such as $T_2$ 424. The $SoC_{OCV}(t_2)$ is calculated in block 508 from the measurement from block 506. The $\Delta SoC$ and error is calculated in block 510 by the following equations:

$$\Delta SoC_{OCV}=SoC_{OCV}(t_2)-SoC_{OCV}(t_0)$$

$$\Delta SoC\ Error=|\Delta SoC_{AH}-\Delta SoC_{OCV}|/T_{AH}$$

The $\Delta SoC$ Error is compared with a threshold value in block 512. In the event that the $\Delta SoC$ Error is greater than the threshold value, a signal indicating an error state will be generated in block 514, and the vehicle operation will change accordingly. If the $\Delta SoC$ Error is less than the threshold value, the system in block 516 will measure the battery current, i, and calculate $\Delta Ah_1$ over the period of time during which the system is powered up, for example from time $t_2$ 424 to a time $t_3$ (not shown). This can be accomplished as a continuous time domain measurement and integration, or it can be the summation of a series of discrete current measurements. Block 518 will monitor when the system shuts down. After it is determined that the system shut down, the $SoC_{AH}$ will be calculated in block 520 and parameters including $\Delta SoC_{AH}$ 408, $T_{AH}$, $SoC_{OCV}(t_0)$ for the recently completed drive cycle will be stored in block 522. The system will shut down in block 524.

Figure 6:
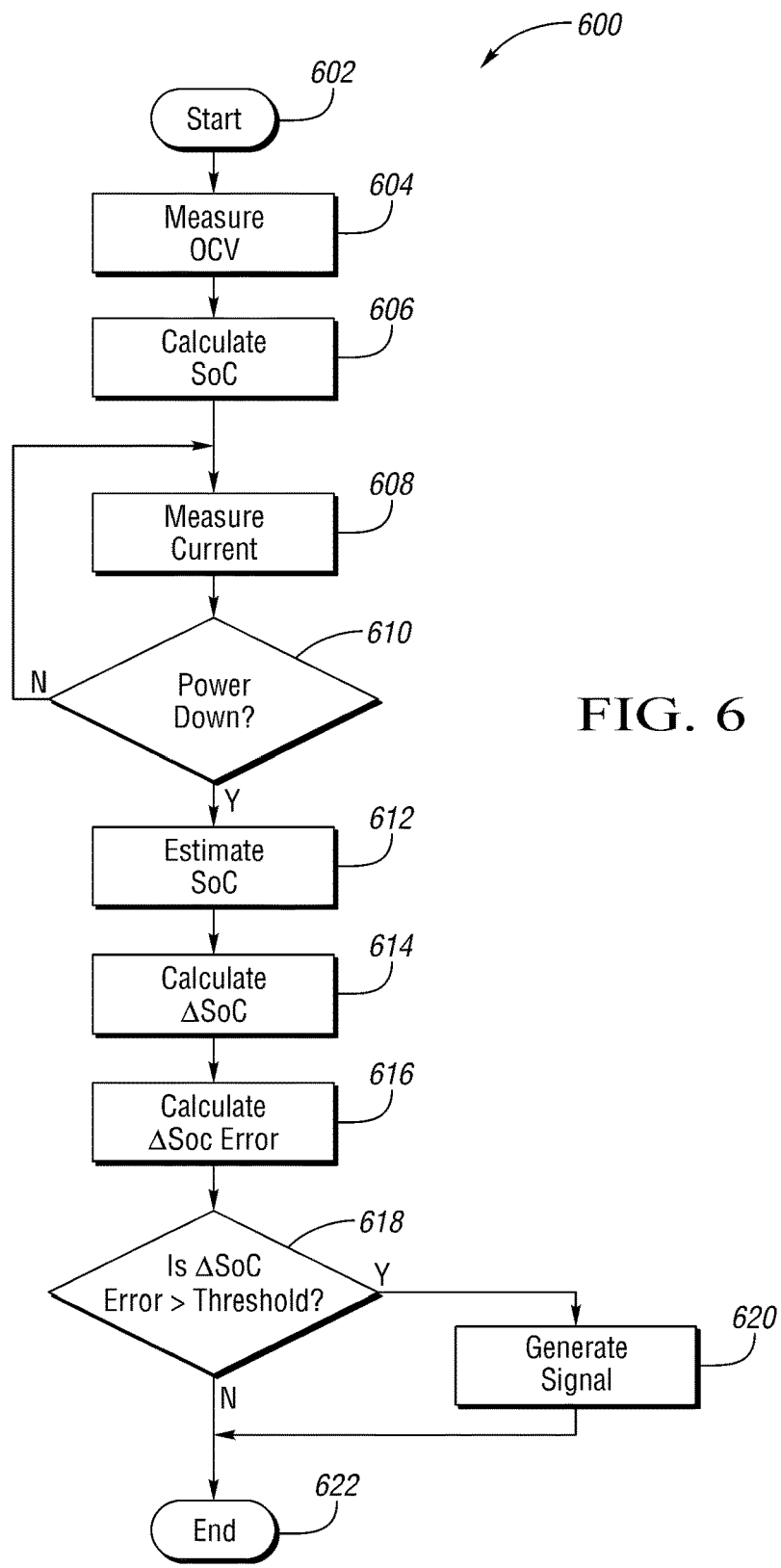
FIG. 6 illustrates a flow diagram of fault detection determined at the end of a single power cycle.

FIG. 6 illustrates a flow diagram of the fault detection determined at the end of a single power cycle 600. This is performed at time $t_1$ 422 where the start 602 is immediately prior to system power up. Next, battery OCV is calculated in 604 and the $SoC_{OCV}(t_0)$ is determined based on the SoC vs. OCV relationship 300 in block 606. In block 608, the battery current, I, is measured and $\Delta Ah_1$ is calculated over the period of time during which the system is powered up, for example from time $t_0$ 420 to a time $t_1$ 422. This can be accomplished as a continuous time domain measurement and integration, or it can be the summation of a series of discrete current measurements. The measurement is continued until the system is determined to be powered down in block 610. In block 612, $\Delta SoC_{AH}$ is estimated based on the current sensor measurements and the integration or summation of the current over the period of time $T_{AH}$. In block 614, $SoC_{OCV}(t_1)$ is first estimated from the OCV and then $\Delta SoC_{OCV}$ is calculated using $\Delta SoC_{OCV}=SoC_{OCV}(t_0)-SoC_{OCV}(t_1)$ and $\Delta SoC$ Error is calculated in block 616 using $\Delta SoC$ Error$=|\Delta SoC_{AH}-\Delta SoC_{OCV}|/T_{AH}$. The $\Delta SoC$ Error is compared with a threshold value in block 618. In the event that the $\Delta SoC$ Error is greater than the threshold value, a signal will be generated in block 620 indicating an error state and the vehicle operation will change accordingly. If the $\Delta SoC$ Error is less than the threshold value, the system will shut down in block 622.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic data tape storage, optical data tape storage, CDs, RAM devices, FLASH devices, MRAM devices and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers, or any other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated.

While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   a battery;
   a sensor configured to sense a current of the battery;
   an electric machine electrically connected to the battery; and
   at least one controller programmed to, in response to detecting an error state for the sensor defined by a difference in pre- and post-drive cycle open circuit voltages of the battery being greater or less than a change in state of charge of the battery for the drive cycle by a predetermined amount, reduced a power limit of the electric machine for a subsequent drive cycle to limit the current from the battery.

2. The vehicle of claim 1, wherein the at least one controller is further programmed to, in response to detecting the error state, output a signal indicating the error state of the current sensor.

3. The vehicle of claim 1, wherein the change in state of charge of the battery is based on a quotient of a net change in ampere-hours of the battery for the drive cycle and a capacity of the battery.

4. A method of controlling a power system for a vehicle comprising:
   in response to a request to activate the vehicle, measuring a first open circuit voltage of a fraction battery prior to start of a drive cycle;
   measuring a current flow of the traction battery during the drive cycle;
   after vehicle deactivation, measuring a second open circuit voltage of the traction battery;
   detecting an error state for a current sensor associated with the traction battery based on a difference between the open circuit voltages and the current flow; and
   in response to detecting the error state, generating an output indicating the error state of the current sensor and reducing a power limit of the electric machine for a subsequent drive cycle.

5. The method of claim 4, wherein the second open circuit voltage is measured upon expiration of a predefined settling time of the traction battery.

6. The method of claim 5, wherein the predefined settling time of the battery is greater than 4 seconds.

7. The method of claim 4, wherein the detecting of the error state is further based on a capacity of the battery.

8. A vehicle comprising:
   a battery; and
   at controller programmed to, in response to detecting an error state defined by a difference in pre- and post-drive cycle open circuit voltages of the battery being greater or less than a change in state of charge of the battery for the drive cycle by a predetermined amount, reduced a power limit of an electric machine electrically coupled to the battery for a subsequent drive cycle.

9. The vehicle of claim 8, wherein the change in state of charge of the battery is based on a quotient of a net change in ampere-hours of the battery for the drive cycle and a capacity.

* * * * *